May 9, 1961 R. E. DE BERNARDI ET AL 2,983,633
METHOD OF FORMING A TRANSISTOR STRUCTURE AND CONTACTS THEREFOR
Filed April 2, 1958

INVENTORS
Robert E. DeBernardi
Gordon E. Moore
BY
Flehr & Swain
ATTORNEYS

United States Patent Office 2,983,633
Patented May 9, 1961

2,983,633

METHOD OF FORMING A TRANSISTOR STRUCTURE AND CONTACTS THEREFOR

Robert E. De Bernardi, Santa Clara, and Gordon E. Moore, Los Altos, Calif., assignors, by mesne assignments, to Clevite Corporation, Cleveland, Ohio, a corporation of Ohio Filed Apr. 2, 1958, Ser. No. 725,876

1 Claim. (Cl. 148—1.5)

Figure 1:
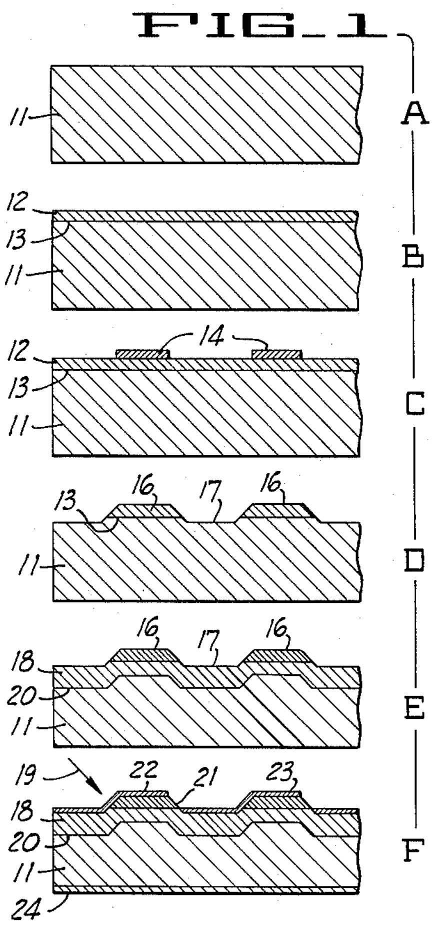

This invention relates generally to a method of forming a transistor structure and contacts therefor, and more particularly to the use of evaporation techniques for forming closely spaced contacts.

In the past, it has been relatively difficult to form a transistor structure having closely spaced emitter and base contacts.

It is a general object of the present invention to provide a method for forming an improved transistor structure having closely spaced contacts.

It is another object of the present invention to provide a method for forming a transistor structure with closely spaced evaporated contacts.

It is another object of the present invention to provide a method for forming a transistor structure in which the emitter and base contacts are closely spaced and formed by angle evaporation.

These and other objects of the invention will become more clearly apparent from the following description when taken in conjunction with the accompanying drawing.

Figure 2:
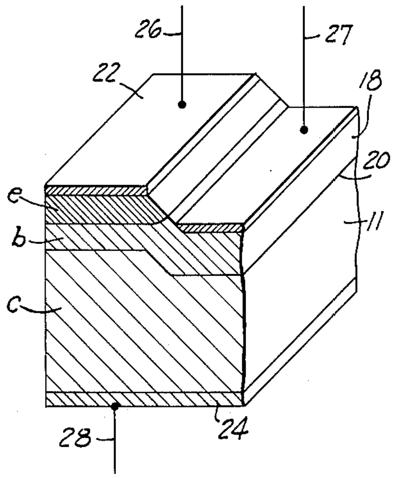
Figure 3:
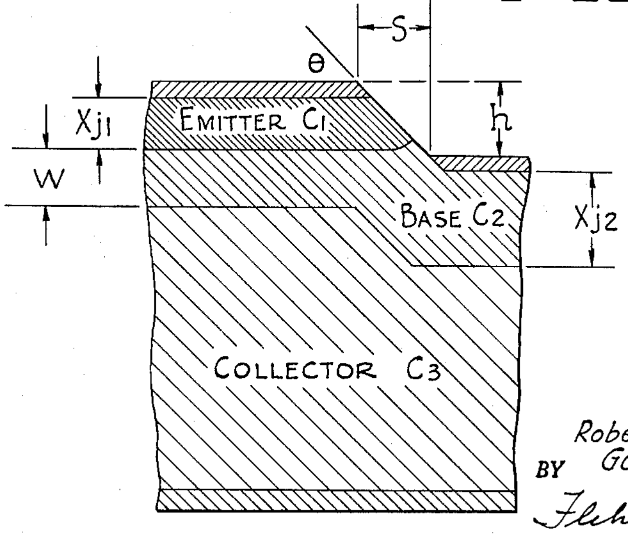

Referring to the drawing:

Figures 1A–F show the steps in the method of forming a transistor structure with evaporated contacts in accordance with the invention;

Figure 2 shows a perspective view of a device formed in accordance with the method of the invention; and Figure 3 shows an enlarged view of a portion of the device.

Generally, in forming a transistor structure with evaporated contacts, a structure is formed in which the emitter surface lies above an exposed region of the base. Contacts are then formed by angle evaporation. The emitter-base junction is formed in the shadow at the step. By making the step relatively shallow, the base-emitter contact separation can be made as small as desired.

Referring to Figure 1A, an n-type block 11 of semiconductive material, for example, silicon which has been suitably doped with donor material is the starting block. The block is masked and subjected to a diffusion operation to form a layer 12 of more intensive n-type material on one surface. A junction 13 is formed. The layer 12 forms the emitter region of the junction transistor as will be presently described. The wafer is suitably masked by wax evaporation, silk screen, or by photoresist techniques to form a plurality of strips 14 separated one from the other, as shown in Figure 1C. The structure is then etched in by a suitable etchant to form a series of islands or ridges 16 including the junction 13 separated by a series of valleys 17.

The wafer is then suitably cleaned and the masking material 14 is removed. The wafer is subjected to another diffusion operation to form a p-type base layer 18 as shown in Figure 1E. The p-type material is not only diffused directly into the block 11, but is also diffused into and through the ridges 16. By using an acceptor material which diffuses more rapidly than the donor material the diffusion of p-type material overtakes any additional diffusion of the ridges into the block 11. The diffusion of acceptor material into the strips 16 tends to counteract the higher intensity of n-type material therein. However, the ridges 16 may remain in a condition having more donor impurities than the block 11. The base layer has varying thickness being relatively thin below the ridges 16, and relatively thick in the region of the valleys 17. The layer 18 forms a collector junction 20 with the region 11.

The completed wafer is then subjected to an evaporation operation in which silver or other suitable contact material is evaporated thereon. In accordance with the invention, the evaporation is carried on at an angle. As shown in Figure 1F, the evaporation is in the direction shown by the arrow 19. Thus, a conductive layer makes ohmic contact, as indicated, with the underlying wafer. No conductive material is deposited in the region 21 (the shadow of the step) which has the exposed emitter-base junction. Thus, a pair of contacts 22 and 23 are formed which are closely spaced at the step 21. It is observed that by varying the angle of the step that the contacts 22 and 23 may be made to lie as close to one another as desired.

An additional evaporation will serve to form an ohmic contact 24 on the bottom surface.

Referring to Figure 2, a device in accordance with the invention is shown in perspective. The various contacts are shown together with associated emitter lead 26, base lead 27 and collector lead 28 suitably attached thereto.

Referring to Figure 3, a device formed in one particular example is shown. The starting block 11 was formed of silicon which had been suitably doped with impurities to have an impurity concentration of $1.3\times10^{15}$ atoms per cc. The block was then subjected to a diffusion in the presence of antimony in which antimony was deposited for 20 minutes a 1,250° C. from a $Sb_2O_3$ atmosphere. The wafers were then masked by wax evaporation in alternate ¾ mm. strips and steps of 10 microns depth were etched in a 20:1 nitric acid:hydrofluoric acid solution. The wafers were degreased to clean them and diffused with gallium to form a base layer having the desired surface concentration and junction depth. Contacts were made by evaporating silver at an angle $\theta$ of 30°. Referring to Figure 3, the various values were as follows:

| | |
|---|---|
| $C_1$ | $½\times10^{20}$ atoms per cc. |
| $C_2$ | $3.8\times10^{18}$ atoms per cc. |
| $C_3$ | $1.3\times10^{15}$ atoms per cc. |
| $X_{J1}$ | 1.4 microns. |
| $X_{J2}$ | 3.1 microns. |
| $w$ | 1.7 microns. |
| $h$ | 10 microns. |
| $\theta$ | 30°. |

The transistor was tested and showed a relatively high $\beta$, as would be expected from the heavy emitter doping and extremely thin base layer. A transistor made in accordance with the foregoing was made to oscillate at 108 mc.

Thus, it is seen that an improved method for forming a transistor is described. The emitter-base contacts can be made as close as possible and are easily formed. The method provides an improved high frequency device.

We claim:

The method of forming a transistor which comprises subjecting a block of one conductivity type to a diffusion operation to form a layer making a junction therewith, etching said structure to form a series of steep-sided ridges making an angle $\theta$ with the principal plane of the transistor, subjecting the resulting structure to a diffusion operation to form an underlying region of opposite conductivity type forming a junction with said block and said layer, evaporating metallic contacts at an angle less than $\theta$ with respect to the principal plane of the transistor whereby spaced contacts are formed with the upper surface of said ridges and the exposed portions of said underlying region, said contacts being separated a distance corresponding to the length of the sides of said ridges.

References Cited in the file of this patent

UNITED STATES PATENTS

| | | |
|---|---|---|
| 2,588,254 | Lark-Horwitz et al. | Mar. 14, 1952 |
| 2,802,159 | Stump | Aug. 6, 1957 |